United States Patent
Nakamura

(10) Patent No.: US 7,361,912 B2
(45) Date of Patent: Apr. 22, 2008

(54) DOPING METHOD, DOPING APPARATUS, AND CONTROL SYSTEM FOR DOPING APPARATUS

(75) Inventor: Osamu Nakamura, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 220 days.

(21) Appl. No.: 11/222,765

(22) Filed: Sep. 12, 2005

(65) Prior Publication Data
US 2006/0005768 A1   Jan. 12, 2006

Related U.S. Application Data

(62) Division of application No. 10/610,755, filed on Jul. 2, 2003, now Pat. No. 6,960,498.

(30) Foreign Application Priority Data

Jul. 4, 2002   (JP)   .............................. 2002-196493

(51) Int. Cl.
*H01J 37/317* (2006.01)
(52) U.S. Cl. .............................. 250/492.21
(58) Field of Classification Search ............ 250/492.21
See application file for complete search history.

(56) References Cited

U.S. PATENT DOCUMENTS

| | | | |
|---|---|---|---|
| 4,727,044 A | 2/1988 | Yamazaki | |
| 4,959,700 A | 9/1990 | Yamazaki | |
| 5,064,775 A | 11/1991 | Chang | |

(Continued)

FOREIGN PATENT DOCUMENTS

JP   05-171438   7/1993

(Continued)

OTHER PUBLICATIONS

Chen et al., Study of $PH_3$ and $B2H6$ Ion Beam Species Generated by Inductively Coupled Plasma, 1998 International Conference on Ion Implantation Technology, IEEE Catalog Number 98EX144, pp. 1218-1221, vol. 2.

(Continued)

*Primary Examiner*—Jack I. Berman
(74) *Attorney, Agent, or Firm*—Nixon Peabody LLP; Jeffrey L. Costelli

(57) ABSTRACT

A doping method capable of controlling a dose amount in response to a change the ratio in ion species during a doping process, a control system for controlling a doping amount, and a doping apparatus having a control system are provided. An ion current value of a specific ion in an ion beam is measured. There is an ion detector that measures an ion current value of a specific ion in an ion beam and enters the obtained monitor signal into a control means. Set data for setting a predetermined dose amount is entered into the control means, convert data for obtaining an actual dose amount from the monitor signal is entered into the control means by a memory means. The control means performs data processing on the basis of the input monitor signal and the convert data, a control signal for obtaining the predetermined dose amount is entered from the control means to the dose amount control system to dope the controlled ion beam into the target material.

12 Claims, 11 Drawing Sheets

U.S. PATENT DOCUMENTS

| | | |
|---|---|---|
| 5,104,818 A | 4/1992 | Silver |
| 5,132,754 A | 7/1992 | Serikawa et al. |
| 5,142,344 A | 8/1992 | Yamazaki |
| 5,247,190 A | 9/1993 | Friend et al. |
| 5,313,077 A | 5/1994 | Yamazaki |
| 5,315,132 A | 5/1994 | Yamazaki |
| 5,393,986 A * | 2/1995 | Yoshinouchi et al. .. 250/492.21 |
| 5,399,502 A | 3/1995 | Friend et al. |
| 5,514,879 A | 5/1996 | Yamazaki |
| 5,543,636 A | 8/1996 | Yamazaki |
| 5,614,732 A | 3/1997 | Yamazaki |
| 5,643,826 A | 7/1997 | Ohtani et al. |
| 5,859,445 A | 1/1999 | Yamazaki |
| 5,904,509 A | 5/1999 | Zhang et al. |
| 5,923,962 A | 7/1999 | Ohtani et al. |
| 6,011,277 A | 1/2000 | Yamazaki |
| 6,013,332 A | 1/2000 | Goto et al. |
| 6,165,876 A | 12/2000 | Yamazaki et al. |
| 6,258,638 B1 | 7/2001 | Tanabe et al. |
| 6,353,244 B1 | 3/2002 | Yamazaki et al. |
| 6,455,360 B1 | 9/2002 | Miyasaka |
| 6,960,498 B2 * | 11/2005 | Nakamura ................. 438/181 |
| 2001/0034089 A1 | 10/2001 | Yamazaki et al. |
| 2003/0232465 A1 | 12/2003 | Hayakawa |

FOREIGN PATENT DOCUMENTS

| | | |
|---|---|---|
| JP | 07-130652 | 5/1995 |
| JP | 08-077959 | 3/1996 |
| JP | 09-106779 | 4/1997 |
| JP | 09-219173 | 8/1997 |
| JP | 10-092576 | 4/1998 |
| JP | 10-223553 | 8/1998 |
| JP | 10-302707 | 11/1998 |
| JP | 11-162397 | 6/1999 |
| JP | 2000-311867 | 11/2000 |
| JP | 2001-357813 A | 12/2001 |
| WO | WO 90/13148 | 11/1990 |

OTHER PUBLICATIONS

Schenk et al., Polymers for Light Emitting Diodes, EuroDisplay '99, The 19th International Display Research Conference, Proceedings, Sep. 6-9, 1999, pp. 33-37, Stuttgart University, Germany.

* cited by examiner

DOPING METHOD, DOPING APPARATUS, AND CONTROL SYSTEM FOR DOPING APPARATUS

BACKGROUND OF THE INVENTION

1. Field of the Invention

The present invention relates to an ion doping apparatus and a doping method using the same, and in particular, a high-precise ion doping technology using impurity regions of source and drain regions of a thin film transistor (TFT), and so on.

2. Description of the Related Art

The technology for ionizing impurity elements used for the control of valency electrons of a semiconductor and accelerating the ionized electrons in the electric field for injection has been known as an ion injection method. In late years, the doping has been performed by irradiating ions like a shower for injecting impurity elements into a large area substrate of a liquid display device, a light emitting device, or the like.

The ion doping apparatus (hereinafter, also simply referred to as a doping apparatus) is designed such that a doping chamber is communicated with an ion source and is kept under vacuum while placing a substrate therein to subject the surface of the substrate to an ion current irradiated from the ion source. The ion source comprises a plasma chamber, a lead accelerating electrode system for pulling out ions generated in the plasma chamber, and a decelerating electrode system for controlling the influx of secondary electrons. In this case, a porous electrode is generally used as an electrode, so that ions pass through the pores to form an ion current directing toward the doping chamber.

As a method for plasma generation in the ionic source, there are several processes known in the art, such as a direct discharge system, a high frequency discharge system, and a microwave discharge. In addition, plasma can be confined in the inside of the ion source by the application of an electric field. Alternatively, a cusp magnetic field may be formed by arranging a permanent magnet around the plasma chamber.

In many cases, such a doping apparatus does not require a mass separation, so that all of ion species (positive charges) formed in the plasma chamber is accelerated in the electric field caused by the lead electrodes and injected into the substrate. In many cases, material gas (diboron ($B_2H_6$) or phosphine ($PH_3$)) diluted with dilution gas such as hydrogen is used as a material of gas for the generation of ions. As a result, in addition to the objected impurity ions (boron ions and phosphorus ions), a large amount of hydrogen ions is introduced at the same time.

In the case of using diboron as material gas, ions such as $H^+$, $H_2^+$, $H_3^+$, $BH_x^+$ (X: 1-3), $B_2H_y^+$ (y: 1-6) can be generated. The abundance ratio of these ion species depends on the dilution ratio of material gas and the conditions of plasma generation. When accelerating in the electric field without mass separation, a plurality of these ion species will be irradiated on the substrate.

Concretely, a spectrum shown in FIG. 9 can be obtained by the measurement with an EXB mass separator on each of ion species generated at the time of using diboron gas diluted to 5% with hydrogen as material gas. In this case, the peak of $B_2H_y^+$ ion is observed in the vicinity of a mass number of 20. Furthermore, the peak of $H^+$ ion at a mass number of 1 and the peak of $H_3^+$ ion at a mass number of 3 are observed, respectively.

A faraday cup electrometer (FCE) is used as the doping apparatus and monitors an ion current for adjusting the dose amount of the doping. However, the FCE measures only a current value based on the total ions including diluted-gas ions generated from the diluted gas in addition to the impurity ions such as phospine and diboron (used for the control of valency electrons) generated from the material gas. Therefore, there is a problem that the amount of impurity ions to be injected changes as the ratio of the respective ions generated in the plasma chamber changes.

FIG. 10 is a graph that represents the distributions of elements (boron) with the respective mass numbers of 10 and 11 in an oxidative silicon membrane in the depth direction, which is measured by a secondary ion mass spectrometer (SIMS) The figure shows the changes in concentration at the time of sequentially doping a plurality of substrates using the doping apparatus. In the data shown in the figure, the concentration of boron increases as the number of the doping treatments increases (i.e., the doping process proceeds in the later half) even though each doping treatment is set to the same dose amount. Therefore, the results indicate that the number of the doping treatments increases as the ratio of boron-containing ion species increases.

In addition, in FIG. 11, there is shown variations of threshold voltages among the substrates of TFTs prepared by performing the channel doping under the same conditions. In this case, also, it is observed that the threshold voltage tends to shift to the plus side as the number of doping treatments increases (the number of substrates being processed with doping increases). The results indicate that the amount of introduction of boron increases.

Furthermore, in one of the prior art documents (e.g., Japanese Laid-Open Patent Application No. 2001-357813), there is a method for independently measuring each of the ion species generated from the material gas including the diluted gas by polarizing and separating these ion species with a polarizer. Therefore, such a method allows the control of the doping amount of each ion.

However, several problems have been found in the above process comprising the steps of separating each ion, measuring the concentration of the ion from a current value based on each ion to adjust the amount of the doping. For example, when the amount of the objective ion species such as channel dope is low, the objective impurity ion cannot be detected as the concentration thereof becomes lower than the lower limit of the detectable range.

SUMMARY OF THE INVENTION

For solving the above problems, it is an object of the present invention to provide: an ion doping method that allows an ion doping apparatus to adjust the doping amount of ion species with a high degree of accuracy such that the ion doping apparatus not only adjusts the amount of doping when the ratio of ion species changes but also, in particular, correctly measures the ratio of ion species to be injected at lower concentration; a control system for adjusting the doping amount of ion species; and an ion doping apparatus equipped with such a control system.

In the doping apparatus, the doping amount of the impurity ions (one conductive type impurity ions) for the control of valency electrons can be adjusted appropriately by measuring ions generated from the diluted gas and specific ions generated from the material gas even though the ratio of a plurality of ion species contained in the ions to be injected has changed in the process.

In the present invention, other than the ion containing one conductive type impurity element, an ion (preferably, an ion having a high abundance ratio) except one of the impurity ions contained in the diluted gas and the material gas is used as the above specific ion to be measured, whereby it becomes possible to control the doping amount of ions that contains one conductive type impurity elements to be doped even in the case of channel dope where the concentration of the material gas is low.

For instance, the amount of ions including boron to be generated from the dopant and injected is indirectly found on the basis of the concentration of hydrogen ion obtained by performing the measurement with EXB etc. on hydrogen ion to be generated from the diluted gas when the dopant is diboron and hydrogen is used as the diluted gas. Using this kind of the method, furthermore, it is possible to adjust the doping amount even though the dilution rate of the material gas is high (i.e., the concentration of ions (boron) to be injected is low).

Here, in the case of the doping treatment using gas containing low-concentrate diboron ($B_2H_6$) diluted with hydrogen, spectrums obtained by the measurements with the EXB separator are shown in FIGS. 5A and 5B, respectively.

In FIGS. 5A and 5B, the current value of $H_3^+$ and the current value of $H_2^+$, which are hydrogen ions generated from the dilution gas, are detected while the current value of $B_2H_x^+$ derived from ion species that contains impurity elements generated from the material gas is not detected. This is because the density of diboron is very low but within the concentrations always required in the general channel doping process.

In this way, the present invention is characterized in that the concentration of ions containing impurities elements is indirectly detected by using ions that do not contain impurities elements (ions not containing impurities elements generated from the material gas or the diluted gas) and that are sufficiently detectable in a mass analysis when the ions that contain impurity elements are hardly measured in a direct manner.

Specifically, it is characterized by indirectly detecting the concentration of ions that contains boron using the current value of a specific ion (e.g., the current value of $H_3^+$) among the hydrogen ion species in which sufficient current values are being obtained in FIGS. 5A and 5B without using the current value of $B_2H_x^+$ even when the impurity ion is boron. For more accurately controlling the injection amount of ions, it is preferable to measure the correlation date between the current value of the specific ion ($H_3^+$) measured by the EXB separator and the concentration of the impurity ion (boron) obtained by the SIMS analysis.

In addition, in the case of sequentially performing the doping treatment described above every time each of the substrates is processed, the current value of the specific ion ($H_3^+$) measured for each of the substrates using the EXB separator is shown in FIG. 6. In this figure, the lateral axis of the graph represents the number of the substrates sequentially subjected to the doping treatment and the vertical axis thereof represents the current value of the specific ion ($H_3^+$). As shown in the figure, it is found that the current value of the specific ion ($H_3^+$) decreases as the number of the substrates being treated increases. Furthermore, each of the diluted gas and the material gas contains a fixed amount of the impurities (boron). Thus, it is found that the concentration of ion species that contains impurity elements (boron) increases as the number of substrates being treated increases.

In other words, the present invention is a method of conducting a doping treatment by measuring the amount of current of the specific ion with the EXB separator just before the doping treatment and determining the conditions of a subsequent doping treatment. In addition, the present invention is a program to incorporate the results of the measurement into the doping conditions. Furthermore, the present invention is a doping apparatus on which such a program is installed. The concentration of the impurity elements can be made constant using the present invention. Therefore, a stable threshold voltage can be controlled.

Furthermore, an aspect of the present invention is a doping method in which a plurality of ion species that contain one conductive type impurity element is simultaneously injected into a target material without conducting a mass separation, comprising the steps of: selecting an ion having the maximum abundance ratio among the plurality of ion species to measure an ion current of the selected ion; making a comparison between the ion current of the ion having the maximum abundance ratio and converted data associated with the concentration of the one conductive type impurity element; and adjusting the dose amount of the ion such that the concentration of the one conductive type impurity element to be injected into the target is made to be constant.

Another aspect of the present invention is a doping method in which a plurality of ion species that contain one conductive type impurity element and a specific ion is simultaneously injected into a target material without conducting a mass separation, comprising the steps of: selecting a specific ion among the plurality of ions to measure an ion current of the selected ion; making a comparison between the ion current of the specific ion and converted data associated with the concentration of the one conductive type impurity element; and adjusting the dose amount of the ion such that the concentration of the one conductive type impurity element to be injected into the target is made to be constant.

In each of the above aspects of the invention, the impurity element of the one conductive type may be boron, and the ion having the maximum abundance ratio may be a hydrogen ion.

Furthermore, the hydrogen ion may be one of $H^+$, $H_2^+$, and $H_3^+$.

Another aspect of the present invention is a control system for a doping apparatus, comprising: a dose amount control system having a means for generating a plurality of ions including an ion that contains a one conductive type impurity element and a specific ion at a constant ratio and a means for generating an ion beam constructed of the plurality of ions; an ion detector for measuring the ion current value of the ion beam and entering the obtained monitor signal into a control means; an input means for entering set data for setting a predetermined dose amount into the control means; a memory means for entering a converting data for calculating an actual dose amount from the monitor signal into the input means; and the control means for performing a data processing on the basis of the input monitor signal and the input convert data and entering a control signal for obtaining the predetermined does amount into the dose amount control system, wherein an ion current value of the specific ion contained in the ion beam is measured by the ion detector having a mass separator.

Another aspect of the present invention is a control system for a doping apparatus, comprising: a dose amount control system having a means for generating a plurality of ions including an ion that contains one conductive type impurity element and another ion at a constant ratio and a means for generating an ion beam constructed of the plurality of ions; an ion detector for measuring the ion current value of the ion beam and entering the obtained monitor signal into a control means; an input means for entering set data for setting a predetermined dose amount into the control means; a memory means for entering a converting data for calculating an actual dose amount from the monitor signal into the control means; and the control means for performing a data processing on the basis of the input monitor signal and the input convert data and entering a control signal for obtaining the predetermined dose amount into the dose amount control system, wherein an ion current value of the ion having the maximum abundance ratio in the ion beam is measured by the ion detector having a mass separator.

Furthermore, in each of the above aspects, the ion detector may comprise a first ion detector for measuring a first ion current value on the basis of the total ions included in the ion beam at a position where a target material is placed and a second ion detector for measuring a second ion current value on the basis of the total ions included in the ion beam at a monitoring position.

A further aspect of the present invention is to a doping apparatus comprising the above control system.

BRIEF DESCRIPTION OF THE DRAWINGS

FIGS. 5A and 5B show the results obtained from the different substrates, respectively;

DETAILED DESCRIPTION OF PREFERRED EMBODIMENTS

Embodiment 1

Figure 1:
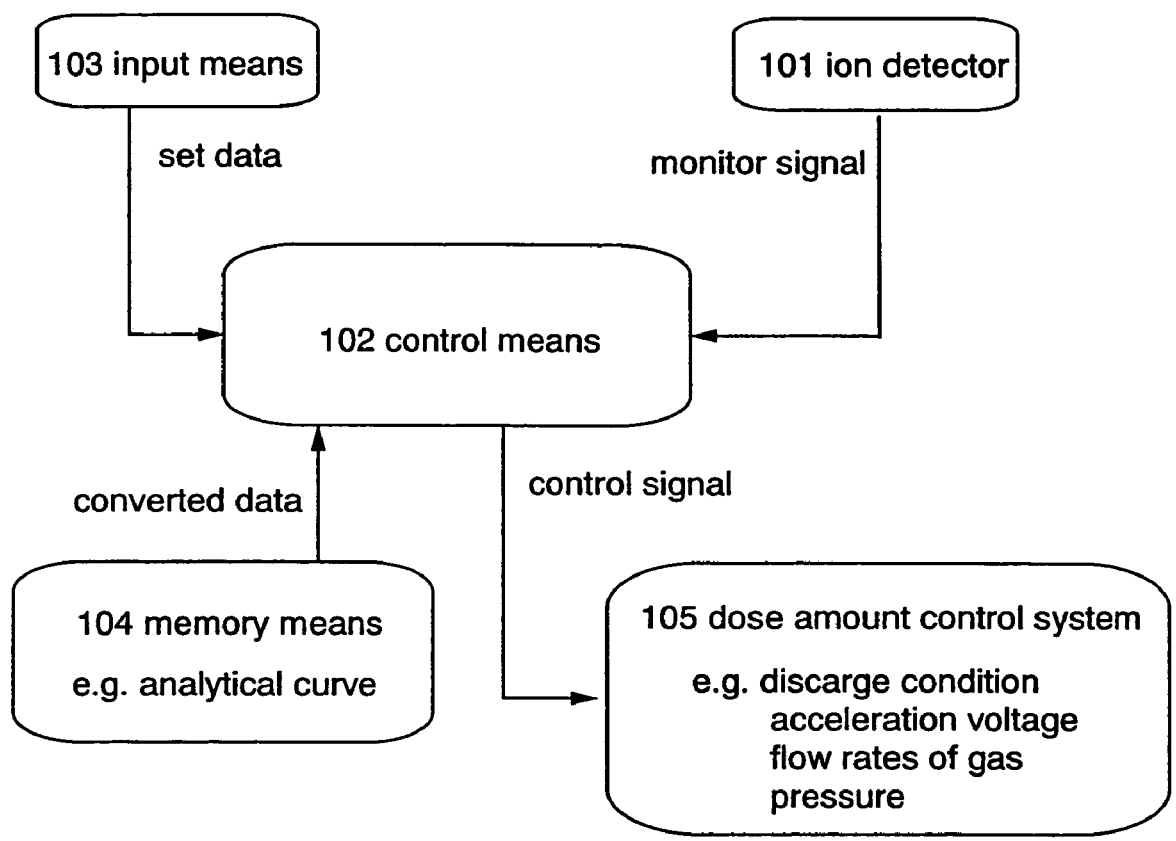
FIG. 1 is a block diagram for illustrating the doping method of the present invention.
Figure 2:
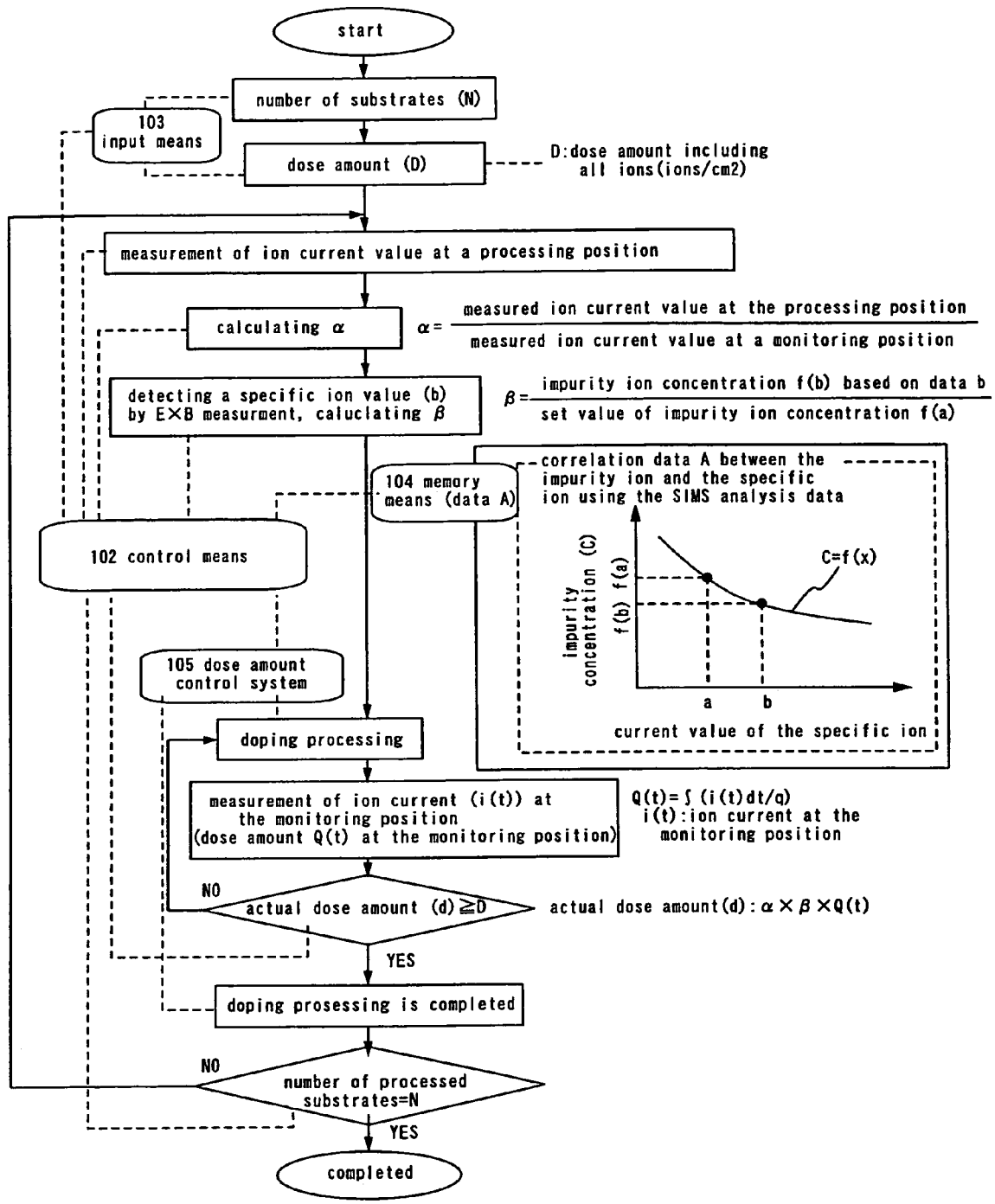
FIG. 2 is a flow chart for illustrating the doping method of the present invention.

In a first embodiment of the present invention, we will describe a method for controlling a dose amount in a doing device of the present invention with reference to FIG. 1 and FIG. 2. Here, the present embodiment will describe the case in which low-concentrated boron is injected using 1% $B_2H_6$ hydrogen-diluted gas with a very small ion-species ratio.

The doping apparatus of the present invention comprises a control system constituted of an ion detector 101 that detects the ion current of an ion contained in an ion beam pulled out of an ion source, a control means 102 where a monitor signal measured by the ion detector 101 is entered, an input means 103 for entering set data for setting a desired dose amount into a control means 102, a memory means 104 for storing data (analytical curve) for converting the data measured by the ion detector to the dose amount in advance and entering the convert data into the control means 102, a dose amount control system 105 for receiving a control signal based on these input data from the control means 102 as shown in FIG. 1.

The control signal entered from the control means 102 is responsible for controlling the parameters related to the control of dose amount (the amount of impurities). The parameters may include discharge conditions, acceleration voltage, the flow rates of material gas, diluted gas, or the like, pressures, and so on.

Referring now to FIG. 2, the doping operation of the doping apparatus constructed as described above will be described in detail.

First, the number of substrates to be introduced into the doping apparatus and the amount of the impurities (the dose amount (set value)) desired to be injected into each substrate are entered one by one. Then, the control means 102 read and incorporate these input data entered by the input means 103. Here, the dose amount at this time is of containing the total ions not only impurity ions but also other ions.

Subsequently, the ion detector 101 obtains a measuring value (ion current value) at a processing position at which the substrate is arranged at the time of doping and a measuring value (ion current value) at a monitoring position. In addition, the ion electric current value at the position where the substrate is arranged is the mean or median of values provided by the measurements at different points. From these values (the measuring value at the processing position and the measuring value at the monitoring position), the conversion value ($\alpha$) can be calculated from the following formula (1).

$$\alpha = \text{the measuring value at the processing position/the measuring value at the monitoring position} \qquad (1)$$

Furthermore, the EXB measurement is performed for detecting a specific ion. Concretely, the measurement is performed on a specific ion among a plurality of ions to be injected at the time of doping using an EXB separation detector.

Here, the term "EXE separation detector" means an assembly prepared by attaching an ion detector for measuring an ion current on an EXB separator. In addition, in the case of a low concentration as in this embodiment, the current value of ion ($B_2H_y^+$) that contains impurity (boron) cannot be measured. Thus, $H_3^+$ ion that allows the biggest electric current is provided as a specific ion. Therefore, the current value of the $H_3^+$ ion will be then obtained. The measurement can be performed during the step of replacing the treated substrate with new one or during the treatment.

Here, the concentration (C) of the impurity ion can be calculated from the current value of the specific iron using the analytical curve (the correlation data A between the impurity ion ($B_2H_y^+$) and the specific ion ($H_3^+$) using the SIMS analysis data) of the memory means 104 shown in FIG. 2. Furthermore, the data A should be measured before the doping processing and stored in the memory means 104 in advance. Here, the current value (a) of the specific iron to the target impurity concentration (f(a)) and the impurity concentration (f(b)) to the measured current value (B) of the specific ion are can be calculated, respectively.

Furthermore, the conversion value ($\beta$) can be calculated from the following equation (2) on the basis of the target impurity concentration (f(a)) obtained from the data A, and the impurity concentration (f(b)).

$$\beta = \text{Impurity concentration } (f(b))/\text{Target impurity concentration } (f(a)) \qquad (2)$$

Subsequently, the doping processing is initiated with a dose amount (D) entered from the input means 103 and read in the control means 102 at first.

Next, an ion current (i(t)) at the monitoring position is measured. Here, an ion detector used for the measurement of an ion current may be Faraday cup instrumentation. A dose amount (Q(t)) at the monitoring position can be calculated with the following equation (3) from the ion current value (i(t)) measured by the ion detector.

$$Q(t) = \int (i(t)dt/q) \quad (3)$$

(wherein q=elementary electrical charge)

Furthermore, the dose amount (Q(t)) obtained here and the conversion value ($\alpha, \beta$) obtained in advance are used together in the equation (4) to calculate the dose amount to the actual substrate (actual dose amount: d).

$$\text{Actual dose amount } (d) = \alpha \times \beta \times Q(t) \quad (4)$$

Here, the measured ion current value is entered in the control means 102 and is then subjected to the data processing based on the equations (1) to (3), followed by being accumulated as new data (actual dose amount: d).

Then, the dose amount (D) entered from the input means 103 is compared with the data measured by the ion detector 101 and the actual dose amount (d) calculated on the conversion data entered from the memory means 104 at the control means 102. As a result, when the actual dose amount (D) reaches the target dose amount (d), the dose amount control system 105 of the doping apparatus receives a signal from the control means 102 to terminate the doping processing, so that the doping processing on the substrate can be terminated. However, when the actual dose amount (d) does not reach to the target dose amount (D), the doping processing is just continued. Subsequently, when it reaches to the target dose amount (D) at last, the processing on the substrate is completed. Here, the so-called dose amount control system 105 used herein includes an ion source, a gas supply system, an electric source for controlling these structural elements, and so on, which are related to the control of the dose amount to be doped in the target material, using their discharge conditions, acceleration voltage, flow rate, pressure, and so on as parameters.

When the doping of one substrate is completed, the next substrate is fed to the processing. Concretely, it is started again to measure the ion current value at the processing positions. A method of processing is carried out by the same way as that of the method previously described. In addition, the predetermined number N of the substrates is subjected to the similar processing, repeatedly. A serious of the doping processing is completed when the predetermined number N of the substrates are completed.

Figure 3:
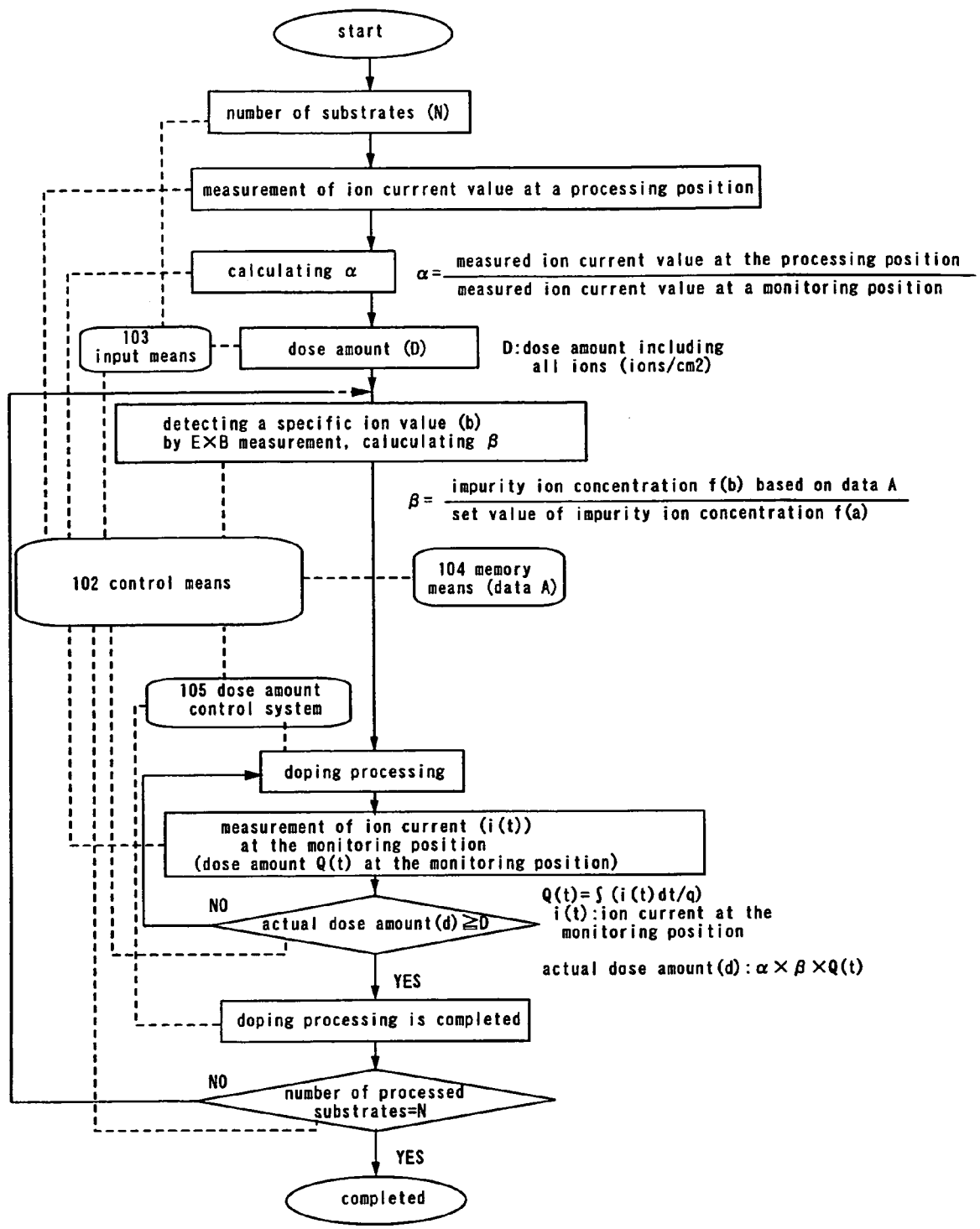
FIG. 3 is a flow chart for illustrating the doping method of the present invention.

In the present invention, furthermore, the processing may be performed by the method shown in FIG. 3 instead of the method shown in FIG. 2.

Furthermore, after completing the doping processing on a sheet of the substrate, the doping processing on the subsequent substrate is initiated again from the measurement of the current value of the specific ion ($H_3^+$) with the EXB measurement. The processing method is performed by the same as one illustrated in FIG. 2. Similarly, a series of the doping processing is completed when the same processing is repeated until the entire predetermined number N of the substrates is processed.

As described above, the impurity concentration is measured from the current value of the measurable specific ion. In the method for adjusting the dose amount, there is an advantage of terminating in a sort time because the measurement may be performed only around the peak of ion having a specific mass when the EXB measurement is desired to be completed in the short time in consideration with throughput.

Embodiment 2

Figure 4:
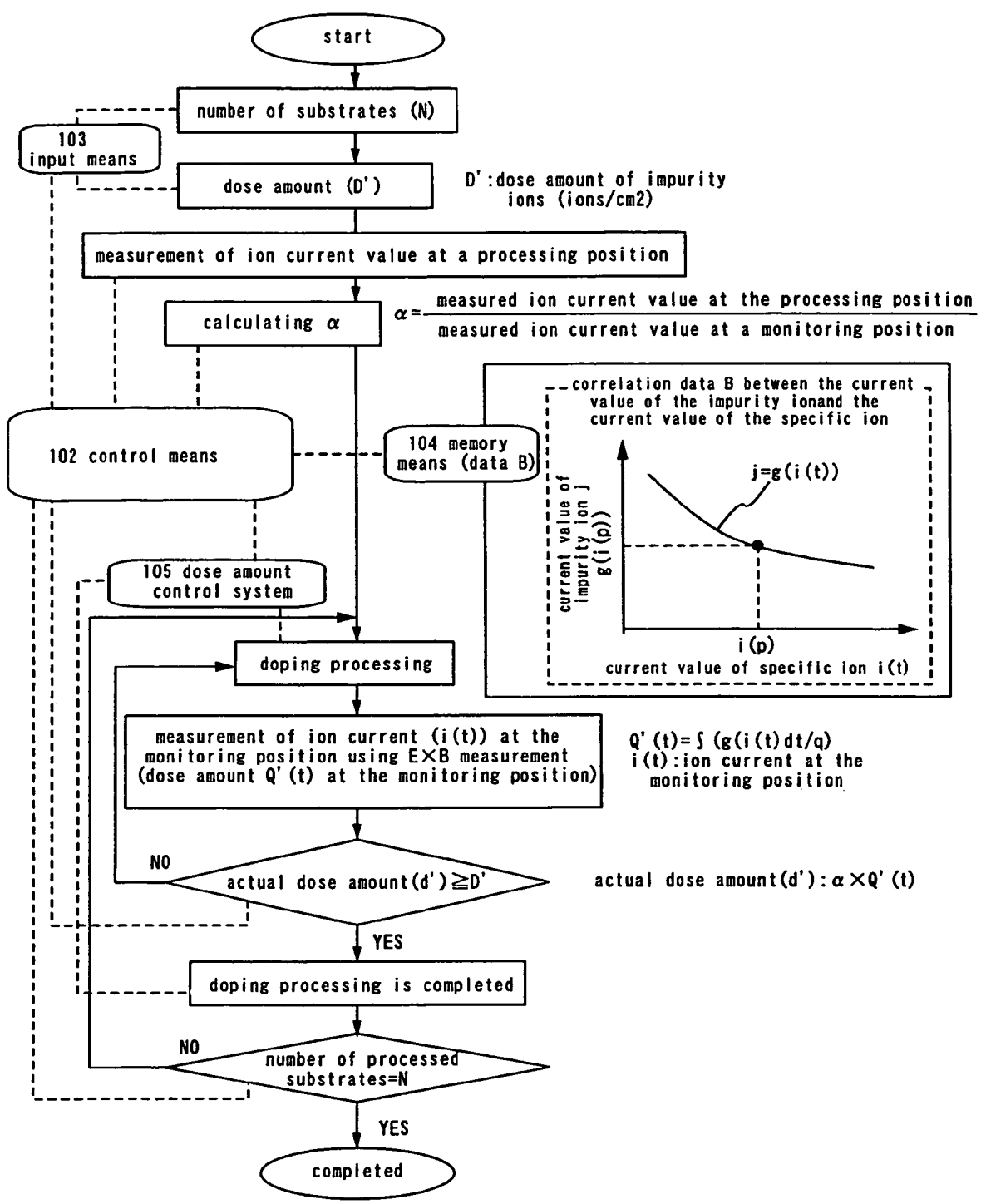
FIG. 4 is a flow chart for illustrating the doping method of the present invention.
Figure 5A:
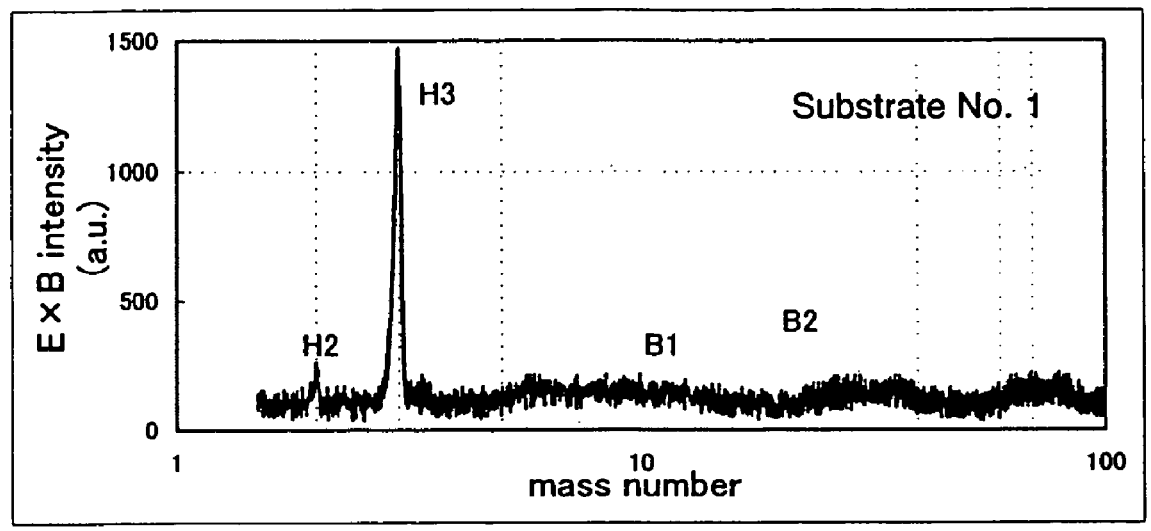
FIGS. 5A and 5B are diagrams showing the results obtained by the EXB measurement, where
Figure 5B:
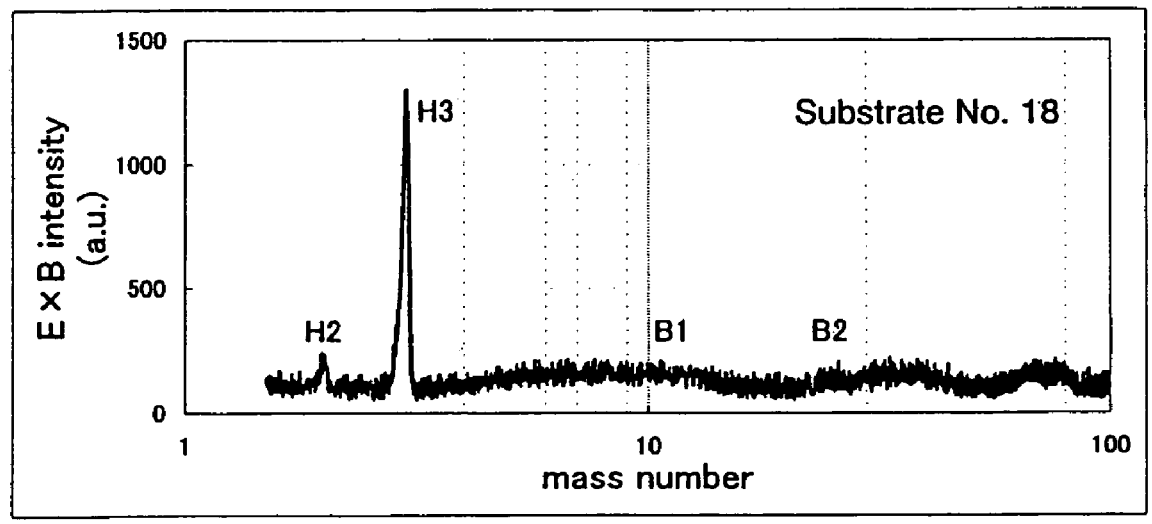
Figure 6:
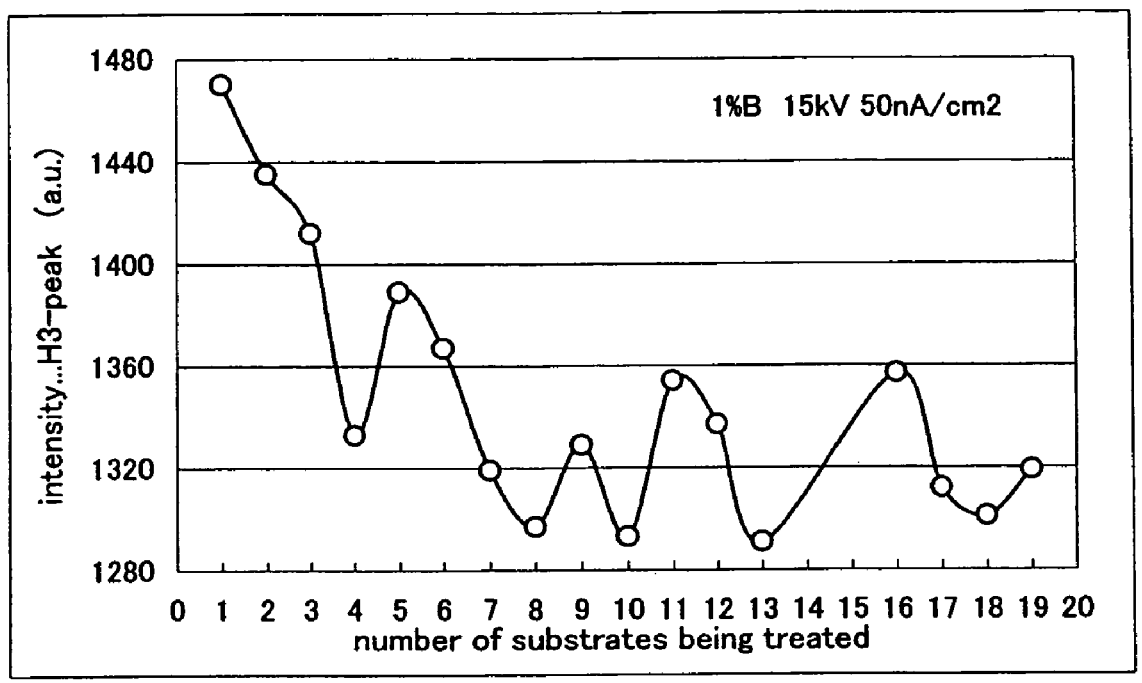
FIG. 6 is a graph showing the results obtained by the EXB measurement.

The method for controlling the dose amount is explained using FIG. 4. In Embodiment 2, different from Embodiment 1, the impurity concentration to be injected into the substrate is calculated from the current value of the specific ion obtained by the EXB measurement.

Here, the steps before obtaining the conversion value ($\alpha$) are the same as those of Embodiment 1, so that the explanation thereof will be omitted from the following description. However, the dose amount (D') of only the impurity ions is entered through the input means 103 and is then read and incorporated in the control means 102. In addition, the dose amount at this time is the dose amount of only impurity ions.

When the conversion value ($\alpha$) is calculated, the doping processing is initiated. Here, in Embodiment 2, a low-concentrated boron is injected using 1% $B_2H_6$ diluted gas with an extremely small ion-species ratio.

Next, the current value (i(t)) is measured by the EXB measurement. The measurement is performed during the processing with the ion detector 101 equipped in the EXB measuring device.

Next, the doping is initiated under the predetermined conditions (e.g., 15 kV, 50 nA/cm$^2$).

Subsequently, the ion detector 101 measures the current value (i(t)) of the specific ion at the monitoring position. Note that, furthermore, the current value (g(i(t)) can be obtained by an analytical curve of the memory means 104 shown in FIG. 4 (the correlation data B between the current value (j) of the impurity ion ($B_2H_y^+$) and the current value (i(t)) of the specific ion ($H_3^+$) obtained by the SIMS analysis). The data B is measured before the doping processing. There is the need of storing the data B in the memory means 104 in advance.

Here, the current value (g(i(t)) of the impurity ion obtained is calculated using the equation (3) described in Embodiment 1, so that the dose amount (Q'(t)) at the monitoring position can be obtained.

Furthermore, the dose amount (actual dose amount: d') to the actual dose amount can be obtained using the following equation (5) with the dose amount (Q'(t)) obtained here and the conversion value ($\alpha$) previously obtained.

$$\text{The actual dose amount } (d') = \alpha \times Q'(t)$$

Here, the measured ion current value is entered in the control means 102 and is then subjected to the data processing based on the equations (3) to (5), followed by being accumulated as new data (actual dose amount: d').

Then the dose amount (D') entered from the input means 103 is compared with the data measured by the ion detector 101 and the actual dose amount (d') calculated on the conversion data entered from the memory means 104 by the control means 102. As a result, when the actual dose amount (d') reaches the target dose amount (D'), the dose amount control system 105 of the doping apparatus receives a signal from the control means 102 to terminate the doping processing. Thus, the doping processing on the substrate can be terminated. However, when the actual dose amount (d') does not reach to the target dose amount (D'), the doping processing is just continued. Subsequently, when it reaches to the target dose amount (D') at last, the processing on the substrate is completed. Here, the so-called dose amount control system 105 used herein includes an ion source, a gas supply system, an electric source for controlling these structural elements, and so on, which are related to the control of the dose amount to be doped in the target material, using their discharge conditions, acceleration voltage, flow rate, pressure, and so on as parameters.

When the doping of one substrate is completed, the measurement of the current value of a specific ion ($H_3^+$) with the EXB measurement thereof is initiated again. A method of processing is carried out by the same way as that of the method previously described. In addition, the predetermined number N of the substrates is subjected to the similar processing, repeatedly. A serious of the doping processing is completed when the predetermined number N of the substrates is completed.

In addition, in Embodiment 1, the process may be performed as shown in FIG. 2. After completing the doping on one substrate, the doping processing of the next substrate may be started from the measurement of ion current value at the processing position.

When the EXB measurement is performed during the processing in Embodiment 1 or Embodiment 2, the EXB measuring device should be arranged on the outside of the processing substrate. However, in the case of a substrate-scanning type injection device, the EXB measuring device may be mounted just below in the vicinity of the substrate (in the case of the vertical ion source) or at the near of the substrate (in the case of a vertical type ion source).

Embodiment 3

In Embodiment 3, we will describe one embodiment of the doping apparatus in accordance with the present invention.

Figure 7:
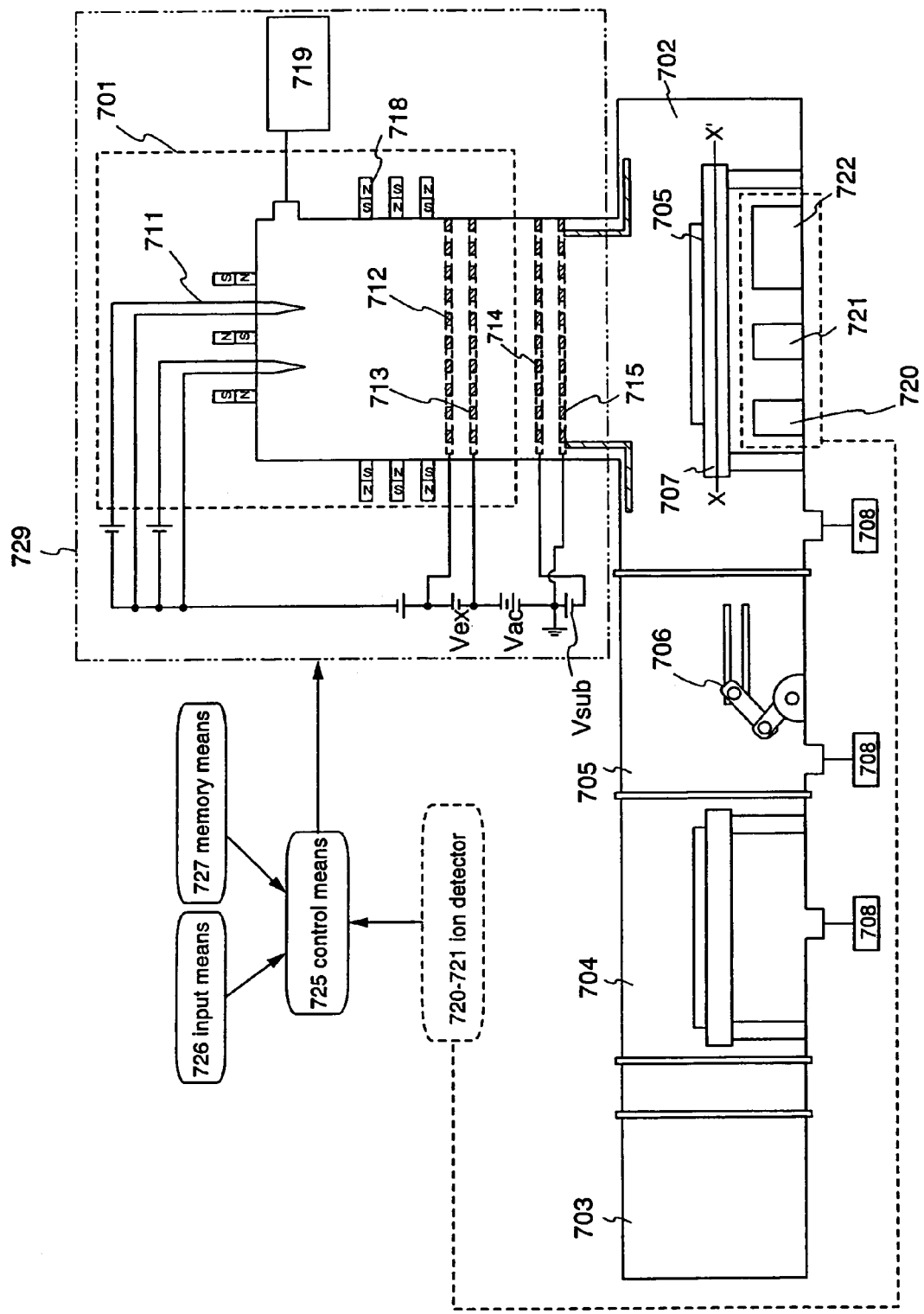
FIG. 7 is a schematic explanation view for illustrating the configuration of the doping apparatus to be used in the present invention.

A doping apparatus shown in FIG. 7 comprises an ion source 701, a doping chamber 702 capable of arranging the substrate on the outlet of the ion current thereof, a road lock chamber 703, a waiting chamber 704, and a transport chamber 705. These chambers 702-705 are communicated with gate bulbs. In addition, the transport chamber 705 has a transport means having a double arm and other chambers are equipped with transport means and substrate-holding means (not shown). In addition, an exhaust means 708 allows the doping chamber 702, the transport chamber 705, the waiting chamber 704, and so on become possible of vacuum exhausting. The exhaust means 708 may be an appropriate combination of a dry pump, a mechanical buster pump, a turbo molecular pump, and so on.

In the doping chamber 702, a substrate is held to perform an ion doping. In the case of processing the substrate having a surface area larger than the opening of the ion flow, the ion doping processing can be performed on the whole surface of the substrate by scanning with a stage 707. In such a case, the cross section of the ion current may be rectangle or linear to irradiate the substrate, so that there is no need of increasing the dimensions of the device. Furthermore, in FIG. 7, the substrate is arranged horizontally, and an ion beam is irradiated in the direction perpendicular to the substrate. For reducing particles, the substrate may be arranged in a vertical direction so as to be irradiated with an ion beam in the direction.

Similar to the conventional ion source, for the purpose of controlling valency electrons, the ion source 701 comprises a gas-supplying system 719 for supplying material gas that contains impurity elements and a filament 711 for generating plasma. Here, but not shown in the figure, there is provided an anode corresponding to the filament provided as a cathode. In the configuration of the doping apparatus shown in FIG. 7, there is shown the generation of plasma in the type of a direct discharge using the filament. However, the plasma may be generated using a capacity coupling type antenna, an induction coupling type antenna, or a high-frequency type antenna may be adapted.

A drawer electrode system comprises a drawer electrode 712, an accelerating electrode 713, an inhibitory electrode 714, and an earth electrode 715. Each of these electrodes has a plurality of openings so that ions are allowed to pass through these openings. Ions are accelerated by the drawer electrode 712 on which a drawer voltage (Vex) is applied and the accelerating electrode 713 on which an accelerating voltage (Vac) is applied. In the inhibitory electrode 714, ions being dispersed are corrected to increase the directionality of ion current. For instance, the acceleration of ions at energy of 10 to 100 keV is attained by shifting an acceleration voltage (Vac) with the application of a drawing voltage (Vex) of 1 to 20 kV.

The doping gas may be $PH_3$, $B_2H_6$, or the like, which is used at a concentration of about 0.1 to 20% by diluting with hydrogen or inert gas. In the case of $PH_3$, $PH_x^+$, $P2H_x^+$, $H_x^+$, and so on are generated as ion species. When the mass separation is not performed, ions are accelerated by the drawer electrode system and introduced into the doping chamber 702 in which the substrate is mounted. Ions are almost linearly pulled out using four electrodes and are then irradiated on the substrate.

Furthermore, in the doping chamber 702, an ion detector for measuring the injected ion current value is installed. Concretely, there are an ion detector 720 for measuring an ion current value at the monitoring position, an ion detector 721 for measuring the processing position to measure the dose amount to be injected into an actual substrate, and an EXB separation detector 722. In addition, the EXB separation detector 722 is designed as a combination of an EXB separator and an ion detector. Thus, the ion detector detects only the ion current value separated by the EXB separator.

Figure 8:
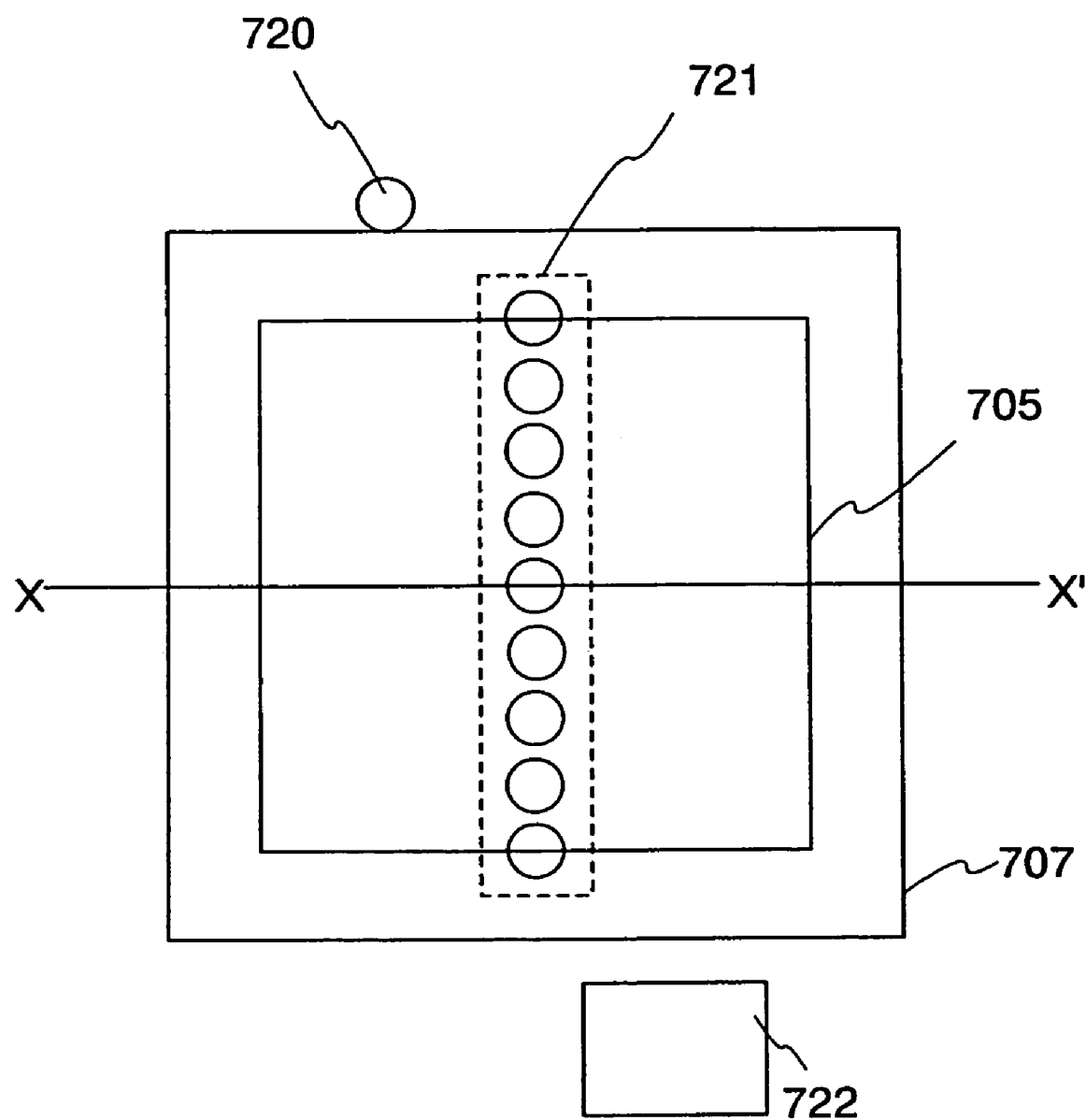
FIG. 8 is a schematic explanation view for illustrating the configuration of the doping apparatus to be used in the present invention.
Figure 9:
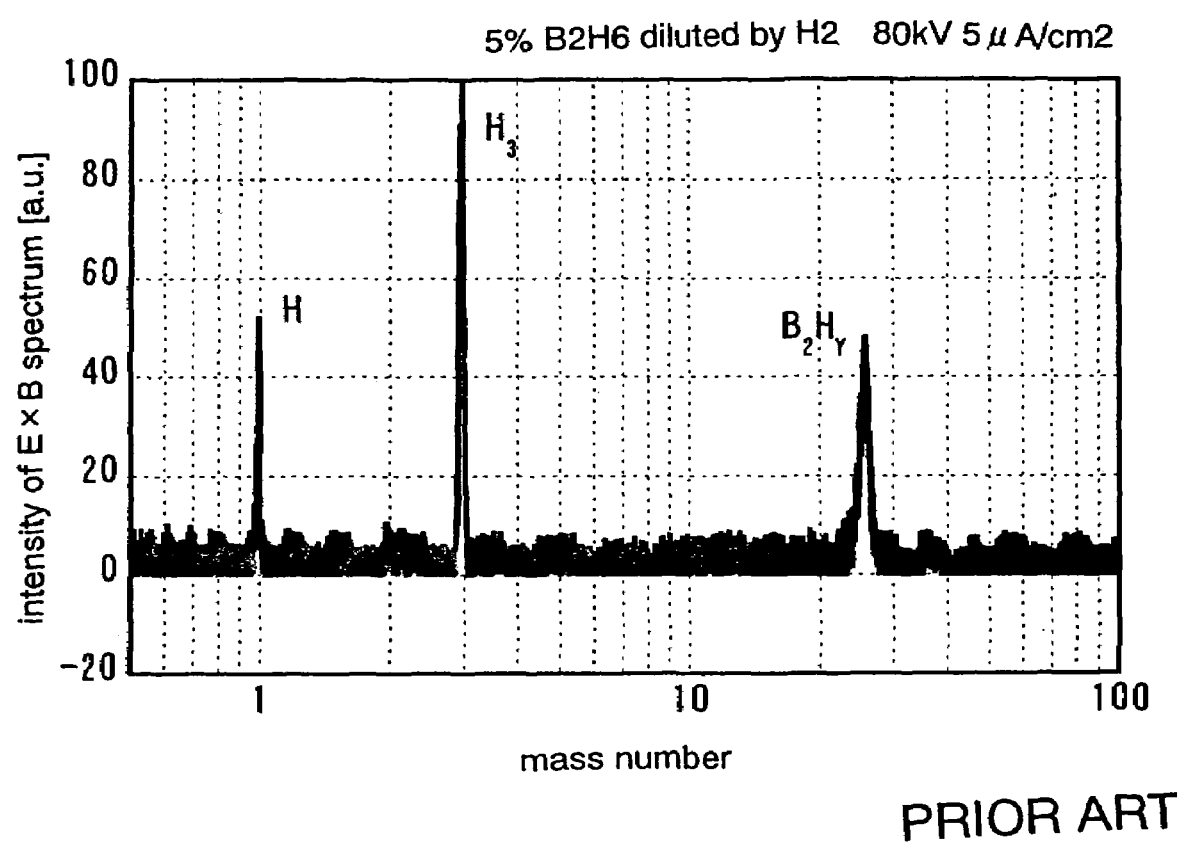
FIG. 9 is a graph for illustrating the prior art.
Figure 10:
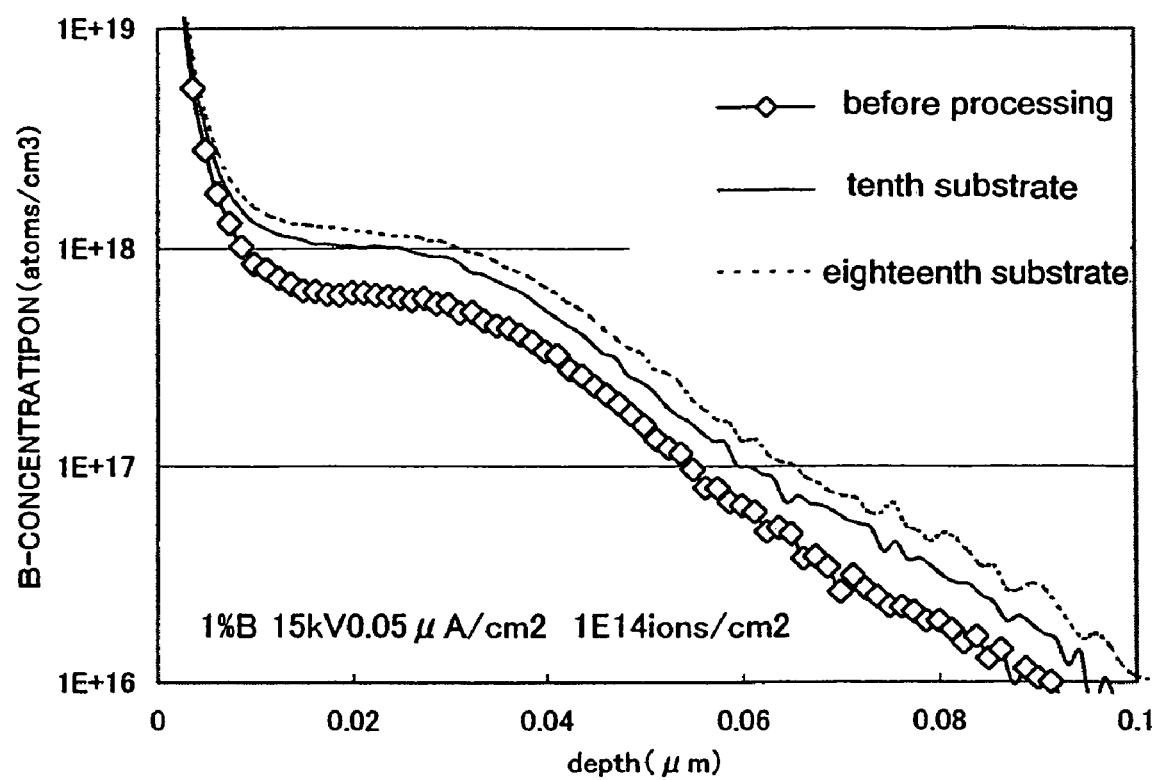
FIG. 10 is a graph for illustrating the prior art.
Figure 11:
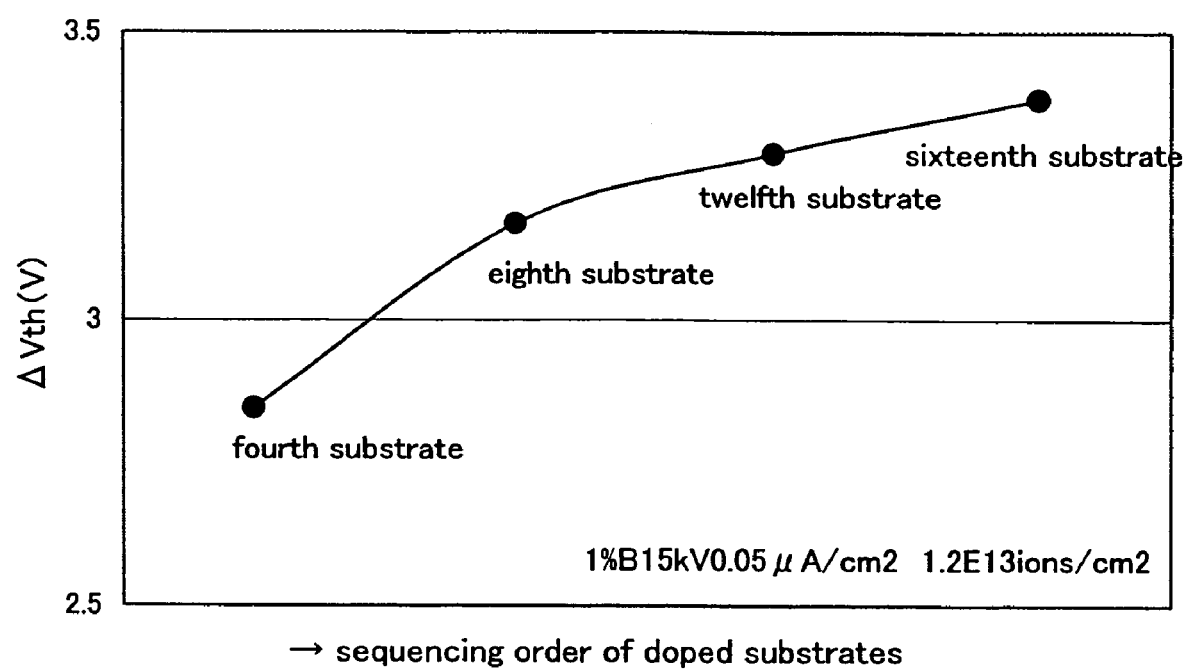
FIG. 11 is a graph for illustrating the prior art.

Referring now to FIG. 8, there is shown the positional relationship among the ion detector 720 for measuring the ion current value at the monitoring position, the ion detector 721 for the measurement of a processing position, and the EXB separation detector 722, which are arranged in the doping chamber 702 shown in FIG. 7.

FIG. 8 is a top view of the substrate having the doping chamber 702 shown in FIG. 7. The line X-X' shown in FIG. 8 corresponds to the line X-X' shown in FIG. 7. In addition, the structural components shown in FIG. 8 are represented by the same reference numerals as those of FIG. 7, so that these figures may be property made reference to each other.

In FIG. 8, the ion detector 720 for measuring the ion current value is arranged at the monitoring position such that the ion detector 720 is not overlapped with the substrate 705 and the stage 707.

Furthermore, a plurality of the ion detectors is arranged on the middle of the substrate 705. In addition, the mean value or the median value of the ion current values measured by a plurality of the ion detectors will be an ion current value at the processing position of the doping apparatus of the present invention.

Furthermore, the method for arranging the ion detector for measuring the processing position measurement is not limited to the vertical arrangement shown in FIG. 8. Alternatively, it may be arranged in the horizontal direction or may be arranged so as to be crossed in the middle.

Furthermore, the EXB separation detector 722 is also positioned so as to be not overlapped with the substrate 705 and the stage 707.

Consequently, the doping apparatus of the present embodiment is configured as described above, so that the variations in abundance ratio of the various kinds of ions to be generated by the ion source are suppressed, while allowing the dropping process with a high reproductivity to adjust the concentration of high accuracy impurity elements.

Next, a doping method using such a dripping device 702 will be described with reference to the device shown in FIG. 7.

At first, impurities in the inside of the ion source 701 and the inside of the doping 702 are removed by exhausting in a high vacuum.

The substrates (the target materials) to be subjected to the doping processing are transferred from the road rock chamber 703 and are then brought in the waiting chamber 704 in order. Subsequently, each substrate is transferred into the doping chamber through the transfer means 706 and arranged in place on the stage when a preparation for the doping processing is completed. The transfer means 706 has a double arm structure. That is, when the preceding substrate is in the doping chamber, one of the arms pulls out the substrate from the doping chamber while the other arm transfers a subsequent substrate into the doping chamber 702.

When the substrate is brought in the doping chamber 702, the predetermined material gas is supplied through the gas-supplying system 719. In the case of doping phosphorus, phosphorus gas diluted with hydrogen is used. In the case of doping boron, diboron diluted with hydrogen is used. The direct current is applied on the filament while the pressures of the ion source 701 and the doping chamber 702 are maintained at constant by adjusting the amount of material gas to be supplied and the exhaust velocity of the exhausting means. Consequently, plasma is generated in the ion source 701. Then, the material gas is decomposed by the plasma, generating a plurality of ion species. The generated ion species can be accelerated by applying a predetermined direct current voltage on the drawer electrode 712 and the accelerator electrode 713 to irradiate the accelerated ions on the substrate placed on the stage 707 to allow the doping processing.

At the time of the doping, the measurement of an ion current value for knowing the dose amount is carried out by the ion detector.

In the ion detector, the ion detector 720 for measuring the ion current value at the predetermined monitoring position is mounted in the ion detector.

In addition, the ion current value of the specific ion contained in the ion beam at the time of doping is measured by the ion detector (the EXB separation detector) 722 integrally formed with the EXB separator.

For obtaining the dose amount at the position of the substrate to be doped, there is the need of measuring the ion current value using the ion detector 721 previously arranged at the substrate position (the processing position).

Consequently, monitor signals based on the ion current values measured on the respective ion detectors (720 to 722) before or during the doping processing are transferred to the control means 725. In the control means 725, in addition to the monitor signals, the data processing described in Embodiment 1 or 2 is performed on the basis of data entered through the input means 726 and the memory means 727 to determine the presence or absence of the continuation of the doping processing.

When the termination of the doping processing is determined in the control means 725, a control signal based on the termination is transferred to the dose amount control system 729 of the doping apparatus to complete the doping processing. In addition, when the continuation of the doping processing is determined in the control means 725, a control signal based on the continuation is transferred to the dose amount control system 729 of the doping apparatus to allow the continuation of the doping processing.

Furthermore, when the doping is completed by the dose amount control system 729, the electric power application on the filament, and the termination of the supply of material gas, the termination of iron irradiation, and so on are carried out.

Then, the doped substrate is collected from the doping chamber 702 through the transfer means, completing a series of the processing.

According to such a process, the data measured by the ion detectors (720 to 721) can be fed back to perform the doping, so that a high accuracy ion-doping processing can be realized.

In addition, in the case of performing the doping using the method as described above, for instance a channel doping for controlling the threshold voltage of the TFT, the control of a sufficient dose amount becomes possible even though the concentration of the impurity to be doped into the semiconductor film is in the range of about $1\times10^{15}$ to $5\times10^{17}$ atoms/cm$^3$.

Adapting the configuration of the present invention, the dose amount can be precisely measured and the dose amount can be adjusted on the basis of the measured data, allowing a stable doping process. Furthermore, making TFT using the doping apparatus having such a control system allows the realization of stable transistor characteristics.

What is claimed is:

1. A doping apparatus comprising:
a doping processing system having a means for discharging an ion beam constructed of a plurality of ion species, wherein the ion beam includes one conductive type impurity element;
an ion detecting means having a mass separator for measuring an ion current value of an ion having the maximum abundance ratio among the plurality of the ion species;
a memory means for memorizing a convening data associating a concentration of the one conductive type impurity element in the target material and the ion current value of the ion having the maximum abundance ratio; and
a control means for calculating an actual dose amount of the one conductive type impurity element based on the ion current value of the ion having the maximum abundance ratio and the convening data, and controlling the doping processing system.

2. The doping apparatus according to claim 1, wherein the one conductive type impurity element is boron, and the ion having the maximum abundance ratio is a hydrogen ion.

3. The doping apparatus according to claim 2, wherein the hydrogen ion is one of $H^+$, $H_2^+$, and $H_3^+$.

4. The doping apparatus according to claim 1, wherein the ion detecting means comprises:
a first ion detector for measuring a first ion current value at a position where a target material is placed; and
a second ion detector for measuring a second ion current value at a monitoring position.

5. A doping apparatus comprising:
a doping processing system having a means for discharging an ion beam constructed of a plurality of ion species, wherein the ion beam includes one conductive type impurity element and a specific ion;
an ion detecting means having a mass separator for measuring an ion current value of the specific ion;
a memory means for memorizing a converting associating a concentration of the one conductive type impurity element in the target material and the ion current value of the specific ion; and
a control means for calculating an actual dose amount of the one conductive type impurity element based on the ion current value of the specific ion and the converting data, and controlling the doping processing system.

6. The doping apparatus according to claim 5, wherein the one conductive type impurity element is boron, and the specific ion is a hydrogen ion.

7. The doping apparatus according to claim 6, wherein the hydrogen ion is one of $H^+$, $H_2^+$, and $H_3^+$.

8. The doping apparatus according to claim 5, wherein the ion detecting means comprises:
a first ion detector for measuring a first ion current value at a position where a target material is placed; and
a second ion detector for measuring a second ion current value at a monitoring position.

9. A doping apparatus comprising:
a doping processing system having a means for discharging an ion beam constructed of a plurality of ion species, wherein the ion beam includes one conductive type impurity element;
an ion detecting means having a mass separator for measuring an ion current value of an ion having the maximum abundance ratio among the plurality of the ion species; and
a control means for calculating an actual dose amount of the one conductive type impurity element based on the ion current value of the ion having the maximum abundance ratio, and controlling the doping processing system.

10. The doping apparatus according to claim 9, wherein the one conductive type impurity element is boron, and the ion having the maximum abundance ratio is a hydrogen ion.

11. The doping apparatus according to claim 10, wherein the hydrogen ion is one of $H^+$, $H_2^+$, and $H_3^+$).

12. The doping apparatus according to claim 9, wherein the ion detecting means comprises:
a first ion detector for measuring a first ion current value at a position where a target material is placed; and
a second ion detector for measuring a second ion current value at a monitoring position.

* * * * *